(12) United States Patent
de Souza et al.

(10) Patent No.: US 7,842,940 B2
(45) Date of Patent: *Nov. 30, 2010

(54) STRUCTURE AND METHOD TO FORM SEMICONDUCTOR-ON-PORES (SOP) FOR HIGH DEVICE PERFORMANCE AND LOW MANUFACTURING COST

(75) Inventors: Joel P. de Souza, Putnam Valley, NY (US); Keith E. Fogel, Hopewell Junction, NY (US); Brian J. Greene, Danbury, CT (US); Devendra K. Sadana, Pleasantville, NY (US); Haining S. Yang, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 82 days.

This patent is subject to a terminal disclaimer.

(21) Appl. No.: 12/062,164

(22) Filed: Apr. 3, 2008

(65) Prior Publication Data

US 2008/0179712 A1    Jul. 31, 2008

Related U.S. Application Data

(63) Continuation of application No. 11/333,074, filed on Jan. 17, 2006, now Pat. No. 7,365,399.

(51) Int. Cl.
*H01L 31/00* (2006.01)

(52) U.S. Cl. .............................. 257/24; 257/9; 438/368; 438/409; 438/753

(58) Field of Classification Search .................... 257/9, 257/24; 438/368, 409, 753
See application file for complete search history.

(56) References Cited

U.S. PATENT DOCUMENTS

| 6,479,365 | B2 | 11/2002 | Lee et al. |
| 6,653,209 | B1 | 11/2003 | Yamagata |
| 6,830,962 | B1 | 12/2004 | Guarini et al. |
| 7,365,399 | B2 * | 4/2008 | de Souza et al. ............ 257/368 |
| 2004/0259315 | A1 | 12/2004 | Sakaguchi et al. |
| 2005/0158933 | A1 | 7/2005 | Inoh |
| 2005/0242352 | A1 | 11/2005 | Jeoung et al. |
| 2005/0260816 | A1 | 11/2005 | Orlowski |
| 2006/0141751 | A1 | 6/2006 | Liao et al. |
| 2006/0255400 | A1 | 11/2006 | Basceri et al. |
| 2007/0069300 | A1 | 3/2007 | Cheng et al. |
| 2007/0096215 | A1 | 5/2007 | Chidambarrao et al. |

* cited by examiner

*Primary Examiner*—Fernando L Toledo
(74) *Attorney, Agent, or Firm*—Scully, Scott, Murphy & Presser, P.C.; Louis J. Percello, Esq.

(57) ABSTRACT

A semiconducting material that has all the advantages of prior art SOI substrates including, for example, low parasitic capacitance and leakage, without having floating body effects is provided. More specifically, the present invention provides a Semiconductor-on-Pores (SOP) material that includes a top semiconductor layer and a bottom semiconductor layer, wherein the semiconductor layers are separated in at least one region by a porous semiconductor material. Semiconductor structures including the SOP material as a substrate as well as a method of fabricating the SOP material are also provided. The method includes forming a p-type region with a first semiconductor layer, converting the p-type region to a porous semiconductor material, sealing the upper surface of the porous semiconductor material by annealing, and forming a second semiconductor layer atop the porous semiconductor material.

13 Claims, 4 Drawing Sheets

STRUCTURE AND METHOD TO FORM SEMICONDUCTOR-ON-PORES (SOP) FOR HIGH DEVICE PERFORMANCE AND LOW MANUFACTURING COST

RELATED APPLICATION

This application is a continuation of U.S. patent application Ser. No. 11/333,074, filed Jan. 17, 2006, now U.S. Pat. No. 7,365,399.

DESCRIPTION

1. Field of the Invention

The present invention relates to a semiconductor structure and a method of fabricating the same. More particularly, the present invention relates to a semiconducting material that can be used as a semiconductor substrate in which the semiconducting material has a buried region of porous semiconductor material beneath a device quality semiconductor layer. The present invention also provides a method of fabricating such as semiconducting material.

2. Background of the Invention

In semiconductor processing, semiconductor-on-insulator (SOI) technology is becoming increasingly important since it permits the formation of high-speed integrated circuits (ICs). In SOI technology, a buried insulating layer, typically an oxide, electrically isolates a top semiconductor layer from a bottom semiconductor layer. The top semiconductor layer, which is often referred to as the SOI layer, is generally the area of the SOI substrate in which active semiconductor device such as, for example, field effect transistors and/or bipolar devices, are built.

Devices formed using SOI technology offer many advantages over the bulk semiconductor counterparts including, for example, higher performance, absence of latch-up, higher packaging density and low voltage applications. More specifically, devices built on SOI substrates have lower parasitic capacitance and leakage current than those that are built on bulk semiconductor substrates. Lower capacitance and leakage current generally provide for devices that operate at faster speeds and lower standby power.

However, SOI substrates have floating body effects and hence body contacts are generally needed on critical devices that cannot tolerate varying body voltage, resulting in a significant device density penalty. Also, SOI substrates are much more expensive than their bulk counterparts because of complex processing and difficult quality control. Typically, SOI substrates are made by a layer transfer process or by an ion implantation process such as SIMOX (Separation by Ion Implantation of Oxygen).

In view of the above, there is still a need to provide new and improved substrate materials that have all the advantages of SOI substrates, yet overcome the floating body effects observed in prior art SOI substrate without requiring a separate body contact.

SUMMARY OF THE INVENTION

The present invention provides a semiconducting material that can be used as a semiconductor substrate that has all the advantages of prior art SOI substrates including, for example, low parasitic capacitance and leakage, without having floating body effects. The elimination of the floating body effects is achieved without separate body contacts that are required in prior art SOI-containing structures.

More specifically, the present invention provides a semiconducting material that can be used as a semiconductor substrate in which a thin semiconductor layer (on the order of about 150 nm or less) is located atop a region that contains a porous semiconducting material. The thin semiconductor layer is typically the area of the semiconducting material (i.e., the SOI layer) in which active semiconductor devices can be formed. Hence, in some embodiments, a portion of the thin semiconductor layer may be used as channel region of a field effect transistor (FET). Other semiconductor devices such as, but not limited to: bipolar devices, capacitors, resistors and diodes are also contemplated in the present invention. Combinations of the aforementioned semiconductor devices are also contemplated.

A thin semiconducting channel region formed on a porous semiconductor material has a low parasitic capacitance and leakage, without having floating body effects, because the device body is tied to lower portions of the inventive semiconducting material via the porous region. The present invention that provides a "Semiconductor-On-Pores" (SOP) material.

In general terms, the SOP material of the present invention comprises:

a top semiconductor layer and a bottom semiconductor layer, wherein said semiconductor layers are separated in at least one region by a porous semiconductor material.

The term "semiconductor" is used herein to denote any material (generally single crystal) that has semiconducting properties (i.e., a conductivity between an insulator and a conductor). Examples of such semiconductors include, but are not limited to: Si, SiC, SiGe, SiGeC, Ge alloys, GaAs, InAs, InP and other III-V compound semiconductors. Multilayers of these semiconductors as well as SOI and SiGe-on-insulator substrates are also contemplated herein. Typically, the semiconductors employed in the present invention are Si-containing semiconductors such as Si, SiGe, SiC, and SiGeC. Preferably, the semiconductor is Si.

In some embodiments of the present invention, a region of the porous semiconductor separates only a portion or portions of the top and bottom semiconductor layers. In other embodiments, the top and bottom semiconductor layers are separated entirely by the region of porous semiconductor, i.e., across the entire length of the SOP material.

In addition to the SOP material described above, the present invention also provides a semiconductor structure that comprises at least one semiconductor device located on a surface of the SOP material. That is, the at least one semiconductor device is located on the top semiconductor layer which is located above the region of porous semiconductor material.

The present invention also provides a method of fabricating the SOP material. The method of the present invention comprises: forming a region of porous semiconductor material in a first semiconductor layer; annealing the first semiconductor layer containing the region of porous semiconductor material to seal pores at an upper surface of the porous semiconductor material; and forming a second semiconductor layer on at least said region of porous semiconductor material containing sealed pores.

The present invention also contemplates three-dimensional structures that may include multiple semiconducting layers on the SOP material (formed during SOP formation or after, including by deposition or layer transfer); multiple semiconducting and conductive layers on the SOP material; or multiple buried porous layers with multiple semiconducting, conductive or combinations thereof.

DETAILED DESCRIPTION OF THE INVENTION

Figure 1A:
FIGS. 1A-1F are pictorial representations (through cross sectional views) depicting one embodiment of the present invention in which a region of porous semiconductor material is present along the entire length of the SOP material.

The present invention, which provides a SOP material, a semiconductor structure including the SOP material as a substrate, as well as a method of fabricating the SOP material, will now be described in greater detail by referring to the description provided herein below as well as the drawings that accompany the present application. It is observed that the drawings of the present application provided in FIGS. 1-2 are provided for illustrative purposes and, as such, they are not drawn to scale. Also, it is observed that like reference numerals are used in each of the drawings to denote like materials and/or elements.

As stated above, the present invention provides an SOP material, a method of fabricating the SOP material and semiconductor structures that include the SOP as a semiconductor substrate in which one or more semiconductor devices are formed thereon. The SOP material of the present invention has all of the advantages of prior art SOI materials, while also overcoming the floating body effects that are typically present in prior art SOI. The floating body effects are substantially eliminated in the SOP material of the present invention without the need of body contacts, which are required in prior art SOI materials to eliminate floating body effects. Since no separate body contacts are employed in the present invention, the inventive SOP material does not suffer from the device density penalty of a conventional SOI material including said body contacts. It is further noted that the inventive process of fabricating the SOP material is more cost efficient than that of processing a conventional SOI material.

In general terms, the SOP material of the present invention, which will be described in greater detail herein below, comprises a top semiconductor layer and a bottom semiconductor layer, wherein the semiconductor layers are separated in at least one region by a porous semiconductor material. The process of forming the SOP material of the present invention, the SOP material, as well as the semiconductor structures including the SOP material will now be described in greater detail.

Reference is first made to FIGS. 1A-1F which illustrate one embodiment of the present invention. In this embodiment of the present invention, a SOP material is fabricated such that a porous semiconductor material is located throughout the entire length of the SOP material. That is, a porous semiconductor material is present such that the top and bottom semiconductor layers are not in direct contact with each other. Thus, a SOP material containing a continuous porous semiconductor material is provided in this embodiment of the present invention.

FIG. 1A shows an initial semiconductor layer, i.e., the first semiconductor layer, 10 that is used in forming the SOP material. The first semiconductor layer 10 comprises any semiconducting material (generally single crystal) including, but not limited to: Si, SiC, SiGe, SiGeC, Ge alloys, GaAs, InAs, InP and other III-V compound semiconductors. Multilayers of these semiconductors are also contemplated herein as well as conventional SOI and SGOI (silicon germanium-on-insulator) substrate. In some embodiments of the present invention, the first semiconductor layer is derived from an isotopically pure precursor. When SOI or SGOI substrates are used, the upper layer of the substrate is used as the first semiconductor layer 10 of the present invention. Typically, the semiconductors employed in the present invention are Si-containing semiconductors such as Si, SiGe, SiC, and SiGeC. Preferably, the semiconductor is Si.

The first semiconductor layer 10 may have a single crystal orientation or it may have at least two surface regions that have different crystallographic orientations (e.g., so-called hybrid substrates having different crystal orientations can be used in the present invention). The first semiconductor layer 10 may be unstrained, strained or contain regions of strain and unstrain therein.

Figure 1B:
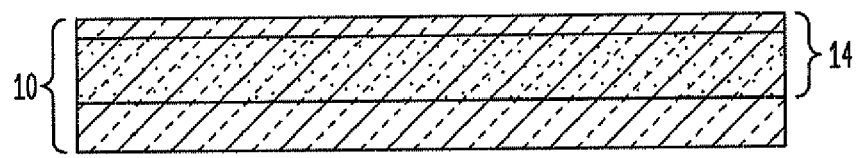

FIG. 1B illustrates the structure after the formation of a p-type dopant region 14 within the first semiconductor layer 10. The term "p-type dopant" is used in the present application to describe an element from Group IIIA of the Periodic Table of Elements. Examples of p-type dopants include, but are not limited to: Ga, Al, B, $BF_2$ or mixtures thereof. In the present application, B or $BF_2$ are particularly preferred.

As shown, the p-type dopant region 14 has an upper surface that is at or near the surface of the first semiconductor layer 10. By "at or near" it is meant that the upper dopant surface is located a depth that is less than 200 nm from the upper surface of the first semiconductor layer 10.

The p-type doping is achieved in the present invention by ion implantation, plasma immersion, in-situ gas phase doping or by forming a sacrificial material such as, for example, a p-type doped silicate glass on the surface of the first semiconductor layer 10 and then annealing the structure to outdiffuse the p-type dopants from the sacrificial material into the first semiconductor layer. In the present invention, ion implantation is preferably used to create the p-type dopant region.

When ion implantation is used in creating the p-type dopant region, the p-type dopant ions are implanted using an energy of greater than 0.1 keV, with an energy from about 0.5 to about 5 keV being more typical. The dosage of the p-type dopant being introduced by ion implantation is typically greater than 1E10 atoms/$cm^2$, with a dosage from about 1E11 to about 5E14 atoms/$cm^2$ being more typical. Within the dosages provided above, the p-type dopant region 14 typically has an n-type dopant concentration of greater than 1E17 atoms/$cm^3$, with a concentration from about 1E18 to about 5E19 atoms/$cm^3$ being more typical. It is noted that the n-type dopant region 14 can be tuned utilizing other ion implantation conditions. The ion implantation may occur at nominal room temperature (i.e., 20'-30° C.) or at a substrate temperature greater than 35° C. with a temperature from about 100° to about 300° C. being more typical.

When plasma immersion is used to introduce the p-type dopants into the first semiconductor layer 10, the plasma immersion is performed by first providing a plasma that includes the p-type dopant. The introduction of the p-type dopant is then performed utilizing plasma immersion conditions that are capable of forming the p-type dopant region 14 at or near the surface of the first semiconductor layer 10. Typically, the plasma immersion is performed utilizing standard operating conditions to achieve similar ion concentrations as stated above via conventional implantation.

When a sacrificial material containing a p-type is used in forming the p-type dopant region 14, a sacrificial material containing the p-type dopants is first deposited on the surface of the first semiconductor layer 10. A block mask can be formed over other regions of the structure in which the p-type dopant is not to be introduced. The sacrificial material layer including the p-type dopant may comprise a boron doped silicate glass, for example. The p-type dopant is present in the sacrificial material in amounts that achieve similar concentrations of the p-type dopants in the first semiconductor layer 10 as that of the ion implantation process mentioned above. The sacrificial material can be deposited by any conventional deposition process such as, for example, chemical vapor deposition, plasma enhanced chemical vapor deposition, evaporation, spin-on coating, and physical vapor deposition. The thickness of the sacrificial material containing the p-type dopants may vary.

After depositing the sacrificial material containing the p-type dopants, the material layer including the p-type dopants is then annealed under conditions that are effective for causing diffusion of the dopants from the material layer into the first semiconductor layer 10. The annealing may be performed in a furnace or in a chamber in which the material layer was initially deposited. The anneal step is performed at a temperature of about greater than 550° C. with a temperature from about 900° to about 1100° C. being more typical. In addition to the specific types of annealing mentioned above, the present invention also contemplates rapid thermal annealing, spike annealing, laser annealing and other like annealing processes that are capable of performing the said outdiffusion. After diffusion, the material layer is typically stripped from the surface of the structure utilizing a conventional stripping process.

Another technique that can be used in forming the p-type dopant region is to introduce the p-type dopant into the first semiconductor layer 10 by in-situ gas phase doping. In such a process, the doping may occur after forming the second semiconductor layer 18 by changing the precursors used in formation of layer 18 to include p-type dopants. It is also possible to conduct the in-situ gas phase doping prior to forming the second semiconductor layer 18 as well.

Figure 1C:
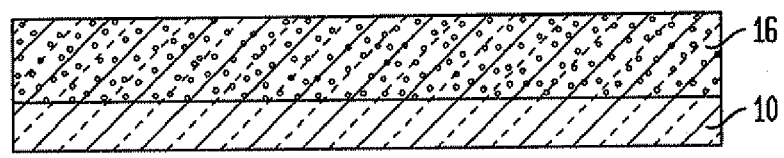

A region of porous semiconductor material 16, such as shown in FIG. 1C, is formed utilizing an anodization technique that is performed in a HF-containing solution. The porous semiconductor material 16 formed in the present invention may have various forms including, for example, fibrous, cyclic, linear, and random. It is noted that the porous semiconductor material 16 is only formed in regions of the first semiconductor layer 10 that include the p-type dopant region 14. The term "HF-containing solution" denotes a mixture of HF and an electrolyte such as hydrocarbons, alcohols, water and the like. The preferred electrolyte employed in the present invention is concentrated HF (49 wt % HF+51 wt % $H_2O$). The anodization process is performed in a HF-containing bath in which the wafer is immersed and biased positively. The bath also includes an electrode that is biased negatively.

HF-anodization is a widely known and generally accepted technique of forming porous Si and other porous semiconductors, such as, for example, Ge and GaAs. By appropriate experimentation involving various HF concentrations, current and voltage levels, doping type (p-type) and dopant concentration in the wafer and anodization time, a recipe of anodization parameters suitable for a specific desired porous layer structure can be found. Any known anodization apparatus can be employed in the present invention in forming the porous semiconductor material 16, so long as it is designed to allow a flow of electrical current in uniform density all throughout the surface area of the first semiconductor layer 10.

In accordance with the present invention, the HF-anodization may be carried out utilizing the following conditions: a HF concentration, in 100% electrolyte, from about 25 to about 50 wt %, with a concentration of HF, in 100% electrolyte, from about 40 to about 50 wt % being more highly preferred. As anodization is driven by electrical current flow, the current is normally set constant at a desired density value during anodization. The constant current density employed during the anodization process is from about 0.1 to about 20 $mA/cm^2$, with an anodization current from about 1 to about 2 $mA/cm^2$ being more highly preferred. Depending on the type and doping density of the first semiconductor layer 10, the voltage that is required to drive the current densities during anodization is typically from about 0.1 to about 10 volts, with a voltage from about 0.5 to about 5 volts being more highly preferred. Anodization is typically performed at about room temperature, for a time period from about 30 seconds to about 10 minutes, with a time period from about 1 to about 5 minutes being more highly preferred.

As stated above, the porosity of the porous semiconductor material 16 can be controlled by the p-type dopant concentration, the current density of anodization as well as the chemistry of the electrolyte. Typically, the porous semiconductor material 16 of the present invention has a porosity from about 0.01 to about 70%, with a porosity from about 10 to about 40% being more highly preferred. The porous semiconductor material 16 is typically formed at or below the upper surface region of the first semiconductor layer 10. The porous semiconductor material 16 is a thin layer having a thickness from about 100 nm to about 2 µm, with a thickness from about 500 nm to about 1 µm being more highly preferred.

Figure 1D:
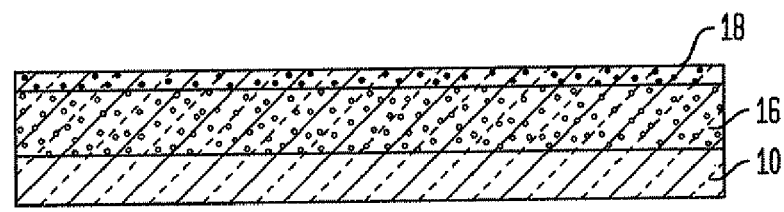

After anodization, the structure containing the porous semiconductor material 16 is briefly annealed in a hydrogen ambient at elevated temperatures to substantially eliminate open pores on the porous semiconductor material 16. The resulting structure including the sealed pores is shown in FIG. 1D. Note that reference numeral 18 is used to denote the surface of the sealed pores. Specifically, the hydrogen anneal is performed at a temperature from about 800° to about 1200° C. for a time period of about 10 minutes to about 2 hours. More specifically, the optional hydrogen anneal is performed at a temperature from about 850° to about 900° C. for a time period of about 30 minutes to about 1 hour. The hydrogen anneal is normally performed utilizing pure 100% hydrogen. But, if needed, it may be admixed with an inert gas such as He, Ar, Xe or a mixture thereof. The amount of hydrogen within the gas admixture is typically from about 50 to about 100%. The pressure of hydrogen used during this optional pre-annealing step is typically from about 10 to about 760 Torr.

Hydrogen annealing is known for inducing surface migration of semiconductor atoms that lead to the substantial elimination of open surface pores. At elevated temperatures, however, the pores in the bulk coalesce into larger pores to minimize the surface energy. Therefore, the hydrogen annealing process, if utilized in the present invention, should not be carried out for a long duration and with too high a temperature.

Figure 1E:
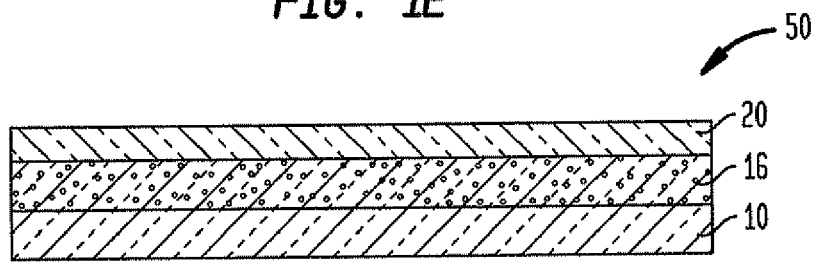

Next, and as shown in FIG. 1E, an epi-semiconductor layer 20 is formed atop the structure shown in FIG. 1D utilizing a deposition method that is capable of growing a low-defect epi-semiconductor layer. The epi-semiconductor layer may comprise the same or different semiconductor material as that of the first semiconductor layer. As shown, the epi-semiconductor layer 20 is formed on the sealed surface of the porous semiconductor material 16. Illustrative examples of suitable deposition methods that can be employed in the present invention include, but are not limited to: chemical vapor deposition (CVD), plasma-assisted CVD, molecular beam epitaxial deposition, and the like. Preferably, the epi-semiconductor layer 20 is comprised of Si. The precursors used in forming the epi layer can, in some embodiments, be isotopically pure. The thickness of the epi-semiconductor layer 20, which typically has a monocrystalline structure, is from of about 10 nm to about 150 nm, with a thickness of from about 25 to about 100 nm being more highly preferred. The epi-semiconductor layer 20 can be unstrained or strained and it will have the same crystallographic orientation as that of the porous semiconductor material 16, which has the same crystallographic orientation as that of the first semiconductor layer 10. It is noted that the epi-semiconductor layer 20 may form the second semiconductor layer of the inventive SOP material.

In some embodiments, the epi-semiconductor layer 20 is replaced with another semiconductor layer (e.g., a second semiconductor layer) that is transferred to the surface of the structure shown in FIG. 1C utilizing a conventional layer transfer process. The layer transfer process may include a bonding step which is performed at nominal room temperature or at elevated temperatures from about 600° to about 1100° C. The layer transfer process may also include a SMART® Cut process. The use of a layer transfer process permits the formation of a hybrid substrate in which the top and bottom semiconductor layers may have, in some embodiments, different crystal orientations.

As such, the structure shown in FIG. 1E depicts the SOP material 50 of the present application. As stated above, the SOP material 50 includes a top semiconductor layer (e.g., the epi-semiconductor or second semiconductor layer 20) and a bottom semiconductor layer (e.g., the first semiconductor layer 10), wherein the semiconductor layers are separated in at least one region by a porous semiconductor material 16. The porous semiconductor material 16 includes an interface with the top semiconductor layer (e.g., layer 20) in which the pores are sealed, i.e., closed.

Figure 1F:
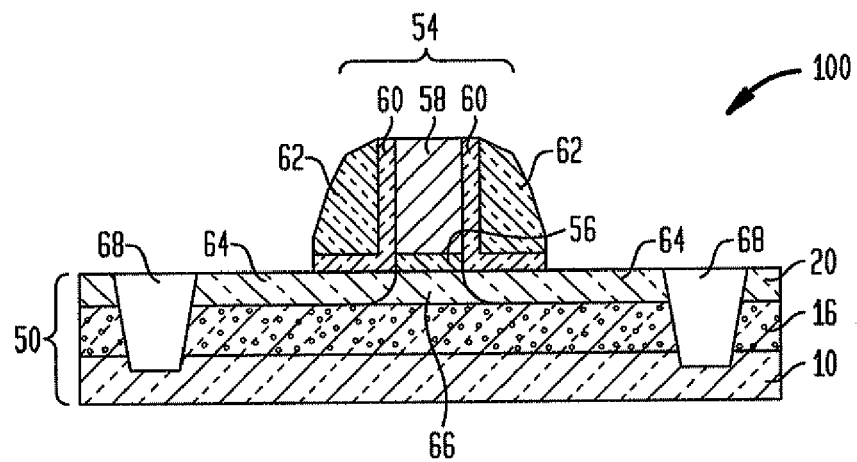

FIG. 1F shows a semiconductor structure 100 of the present invention that includes the SOP material 50 of the present invention as the semiconductor substrate in which one semiconductor device is formed thereon. In the specific embodiment illustrated, the at least one semiconductor device is a field effect transistor 54 that includes a gate dielectric 56 (any insulating oxide, nitride, oxynitride or multilayers thereof or high k dielectrics (dielectric constant greater than 4.0) are also contemplated herein), a gate conductor 58 (polySi, polySiGe, an elemental metal, an alloy of an elemental metal, a metal silicide, a metal nitride, or multilayers thereof), a first set of spacers 60 (any insulating oxide, nitride, oxynitride or multilayer thereof) and a second set of spacers 62 (the same or different, usually different, insulator as that of the first set of spacers 60), source/drain regions 64, and device channel 66. FIG. 1F also shows the presence of isolation regions 68 which are present in the SOP material 50. The isolation regions 68 can be trench isolation regions, as illustrated, or field oxide isolation regions. Trench isolation regions are formed utilizing conventional trench isolation techniques well known in the art, while field oxide isolation regions are formed utilizing a local oxidation of silicon process. The depth of the isolation regions 68 may extend down to and beneath the upper surface of the first semiconductor layer 10, as shown in FIG. 1F. Alternatively, the isolation region can be formed to a depth that extends to the sealed surface of the porous semiconductor material 16 or the depth of the isolation region can also be located within the second semiconductor layer 20 when the second semiconductor layer 20 is relatively thick.

The field effect transistor device shown in FIG. 1F is formed utilizing conventional CMOS processing steps that are well known in the art, including deposition of the various material layers, patterning via lithography and etching, and implantation of source/drain regions. The various material layers of the field effect transistor may also be formed utilizing a replacement gate process. The structure shown in FIG. 1F may also include silicide contacts, source/drain extension regions, halo implant region, stress liners, embedded stress inducing regions, an interlevel dielectric including metal contacts to the source/drain regions as well as the gate, and other like elements that are typically present in semiconductor structures including field effect transistors.

The advantages of employing the SOP material 50 as a substrate for a CMOS device include the following: (i) reduction of junction capacitance to improve device speed; (ii) no floating body effects, hence no body-contact is needed (denser circuits); (iii) tunable dielectric constant by adjusting pore density of the porous semiconductor material; and (iv) a cheaper process as compared with standard SOI processing.

Reference is first made to FIGS. 2A-2D which illustrate another embodiment of the present invention. In this embodiment of the present invention, a SOP material is fabricated such that a porous semiconductor material is located in predetermined areas of the SOP material. That is, a porous semiconductor material is present such that the top and bottom semiconductor layers are not in direct contact with each other in some areas, yet they may be in contact in other areas of the SOI material. Thus, a SOP material containing discrete and isolated regions of porous semiconductor material is provided in this embodiment of the present invention.

Figure 2A:
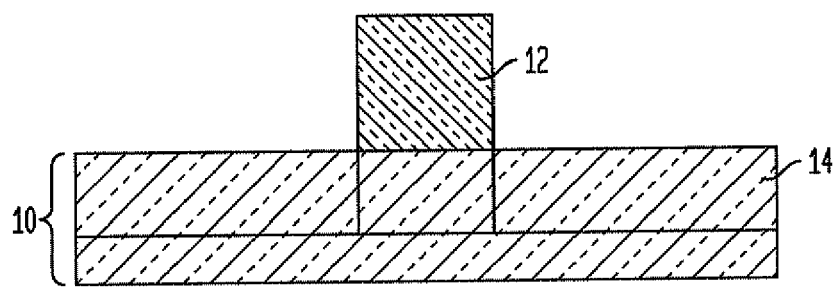
FIGS. 2A-2D are pictorial representations (through cross sectional views) depicting one embodiment of the present invention in which regions of porous semiconductor material are formed in predetermined areas of the SOP material.

FIG. 2A shows a structure after forming the p-type dopant region 14 into the first semiconductor layer 10. This is achieved utilizing the same basic processing as described above in FIGS. 1A-1B except that a patterned mask 12 is formed on the surface of the first semiconductor layer 10 prior to the introduction of the p-type dopants into that layer. The patterned mask 12 which may comprise a photoresist and/or a hard mask material (e.g., oxide or nitride) is formed by deposition, photolithography and optionally etching. The photolithographic process includes exposing a resist material to a pattern of radiation and developing the exposed resist utilizing a conventional resist developer. Although a single patterned mask 12 is shown, the present invention also contemplates cases where a plurality of patterned mask is formed. Etching, which is used in cases when a hard mask material is used, may comprise a dry etching technique (such as, reactive-ion etching, ion beam etching, plasma etching or laser ablation) or a chemical wet etching process. As shown, the patterned mask 12 protects portions of the first semiconductor layer 10, while leaving other portions of the first semiconductor layer 10 exposed. It is at the exposed portions of the first semiconductor layer 10 where the p-type dopants are introduced, thus forming p-type dopant regions 14 in selected areas of the first semiconductor layer 10.

Any of the three different techniques for introducing the p-type dopants into the first semiconductor layer 10 can be used in this embodiment of the present invention as well.

Figure 2B:
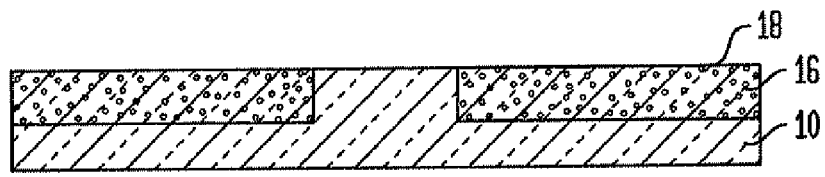

FIG. 2B shows the structure after removing the patterned mask 12 (via a conventional stripping process), subjecting that structure to anodization and annealing. Anodization is performed as described above, forming regions of porous semiconductor material 16 in the first semiconductor layer 10 in areas including the p-type dopant regions 14. Annealing, which closes the pores at the surface, is also performed as described above.

Figure 2C:
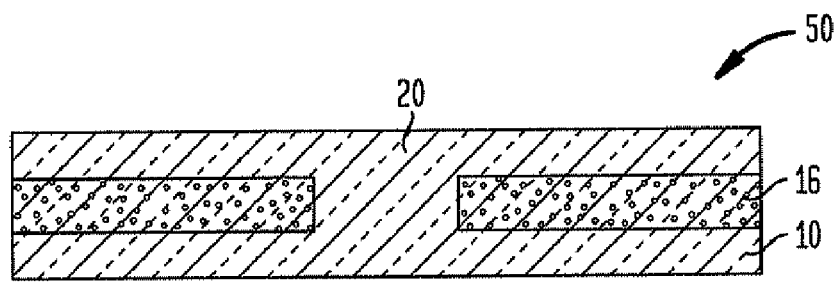

FIG. 2C shows the structure after forming epi-semiconductor layer 20 on the structure shown in FIG. 2B. The epi-semiconductor layer 20 is formed as described above in FIG. 1E. The structure shown in FIG. 2C represents the SOP material 50 formed utilizing this embodiment. Note that the SOP material 50 has discrete and isolated regions (i.e., islands) of the porous semiconductor layer 16. Note that the epitaxial growth process mentioned above may be replaced by a layer transfer process in which a second semiconductor layer is bonded to the structure.

Figure 2D:
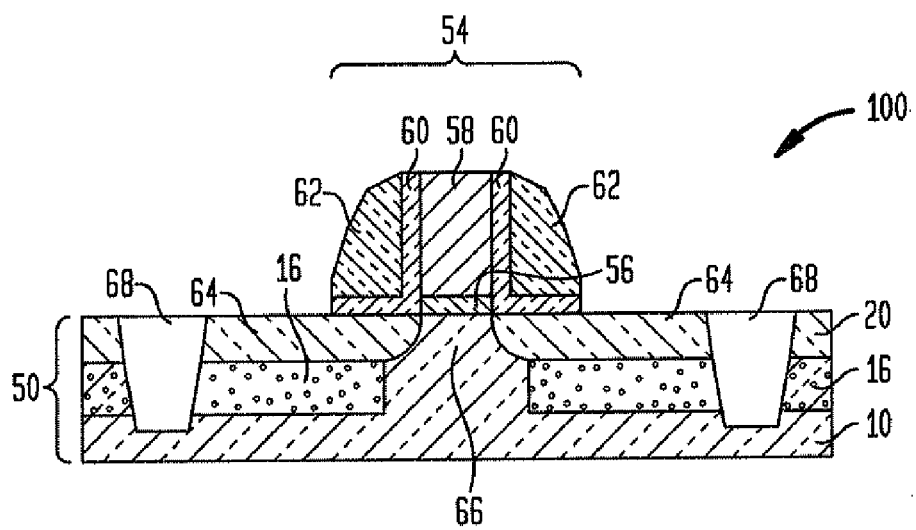

FIG. 2D shows a semiconductor structure 100 that includes the SOP material 50 of FIG. 2C as the semiconductor substrate and at least one semiconductor device, such as a field effect transistor, formed on the surface of the SOP material. The advantages of using this particular SOP material shown in FIG. 2C is that a higher density of pores can be formed locally to significantly reduce junction capacitance and current leakage. Note that the porous regions are located directly beneath the source/drain diffusion regions of the field effect transistor. The structure also has better body contact and heat dissipation since no isolation region is present beneath the device channel region.

Figure 3:
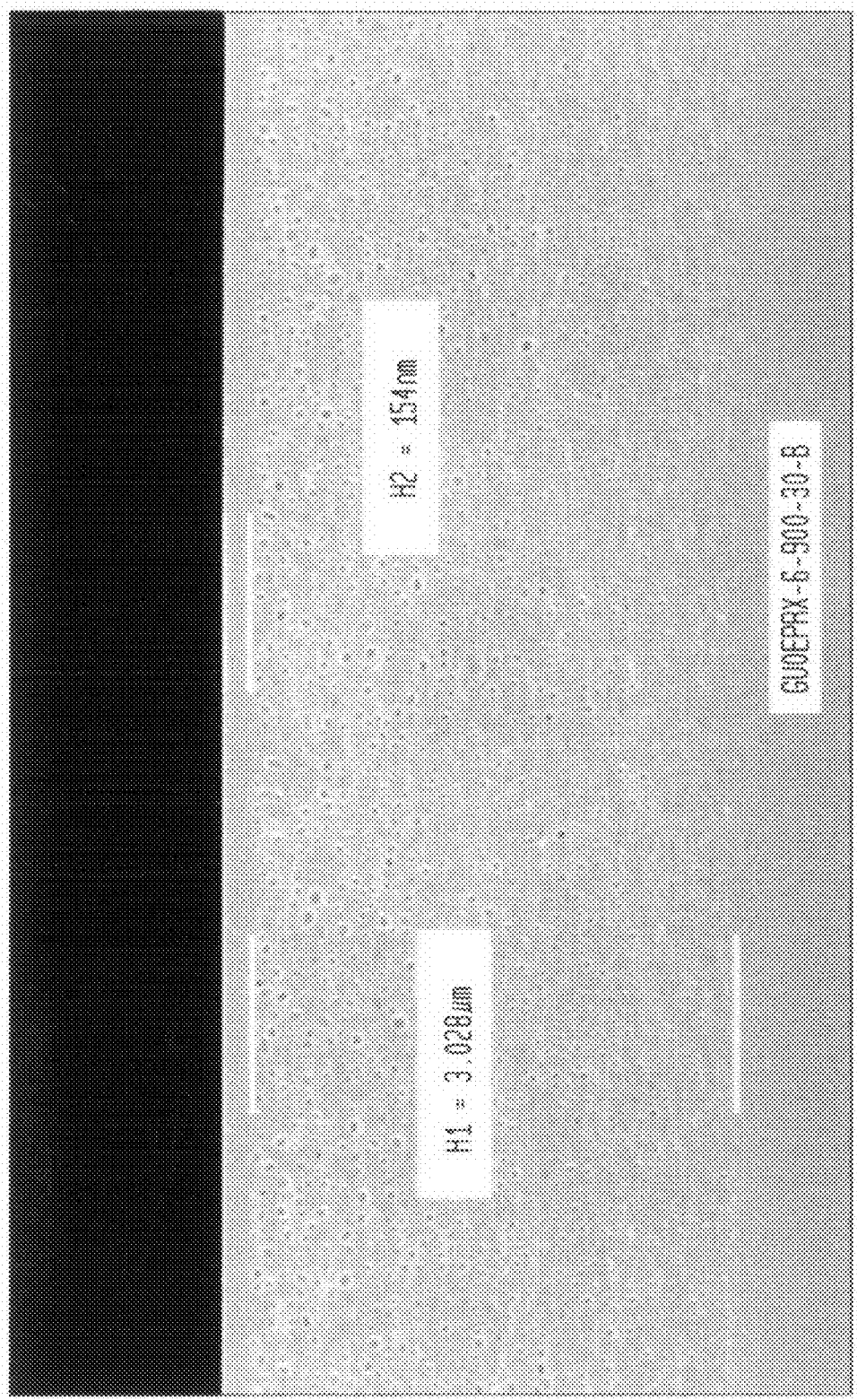
FIG. 3 is a scanning electron micrograph (SEM) showing the SOP material of the present invention.

FIG. 3 shows an actual SEM of the inventive SOP material 50 having a continuous porous semiconductor material. The porous material is clearly evident in the region between the white lines. The material above and below the white lines is the non-porous semiconductor layers (i.e., layers 10 and 20).

The present invention also contemplates three-dimensional structures which may include multiple semiconducting layers on the SOP material (formed during SOP formation or after, including by deposition or layer transfer); multiple semiconducting and conductive layers on the SOP material; or multiple buried porous semiconducting layers with multiple semiconducting, conductive or combinations thereof. The term "semiconducting" denotes any material that has semiconducting properties including, for example, Si, SiGe, SiGe, SiC, SiGeC, Ge alloys, InAs, InP, and other III/V or II/VI compound semiconductors. The other semiconductor layers can be formed during formation of the SOP material or after using deposition or layer transfer. The term "conductive" is used herein to denote materials having a conductive property including, for example, doped polySi, doped SiGe, metals, metal alloys, metal silicides, and metal nitrides. The conductive layers would be formed using deposition techniques well known in the art. These other layers of the three-dimensional structure would be located atop the second semiconductor layer 18. The porous semiconductor layers can be formed utilizing the technique described above.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the spirit and scope of the appended claims.

What is claimed is:

1. A semiconductor structure comprising:
   a substrate having a top semiconductor layer and a bottom semiconductor layer, wherein said semiconductor layers are separated in at least one region by a porous semiconductor material; and
   at least one semiconductor device located on a surface of said top semiconductor layer.

2. The semiconductor structure of claim 1 wherein said at least one semiconductor device is a field effect transistor.

3. The semiconductor structure of claim 1 wherein said porous semiconductor material is continuous such that the top and bottom semiconductor layers are not in direct contact with each other.

4. The semiconductor structure of claim 1 wherein said porous semiconductor material is a discrete and isolated island region.

5. The semiconductor structure of Claim 1 wherein said semiconductor layers are both Si-containing semiconductors.

6. The semiconductor structure of claim 1 wherein said porous semiconductor material has an upper surface in which the pores are substantially closed.

7. The semiconductor structure of claim 1 wherein said porous semiconductor material has a porosity from about 0.01 to about 70%.

8. A method of forming a semiconductor structure comprising:
   forming a region of porous semiconductor material in a first semiconductor layer;
   annealing the first semiconductor layer containing the region of porous semiconductor material to seal pores at an upper surface of the porous semiconductor material;
   forming a second semiconductor layer on at least said region of porous semiconductor material containing sealed pores; and
   forming at least one semiconductor device on a surface of the second semiconductor layer, while maintaining the region of porous semiconductor material beneath the second semiconductor layer.

9. The method of claim 8 wherein said region of porous semiconductor material is formed by providing a p-type dopant region to said first semiconductor layer and subjecting said first semiconductor layer including said p-type dopant region to anodization, said anodization is performed under conditions that convert said p-type dopant region in said region of porous semiconductor material.

10. The method of claim 9 wherein said n-type dopant region is formed by ion implantation, plasma immersion, in-situ gas phase doping or by forming a sacrificial material containing p-type dopants on said first semiconductor layer and annealing said sacrificial semiconductor layer to cause outdiffusion of said p-type dopants into said first semiconductor layer.

11. The method of claim 8 wherein said annealing is a hydrogen anneal that is performed at a temperature from about 800° to about 1200° C.

12. The method of claim 8 wherein said forming said second material layer comprises epitaxial growth or a layer transfer technique.

13. The method of claim 8 further comprising forming at least one semiconductor device on said second semiconductor layer wherein said semiconductor device is located entirely above said region of porous semiconductor material or a portion of said semiconductor device is located above said region of porous semiconductor material.

* * * * *